United States Patent [19]

Wang et al.

[11] Patent Number: 5,382,827
[45] Date of Patent: Jan. 17, 1995

[54] FUNCTIONAL SUBSTRATES FOR PACKAGING SEMICONDUCTOR CHIPS

[75] Inventors: Wen-chou V. Wang; William T. Chou, both of Cupertino, Calif.

[73] Assignee: Fujitsu Limited, Kanagawa, Japan

[21] Appl. No.: 927,151

[22] Filed: Aug. 7, 1992

[51] Int. Cl.[6] .................... H01L 27/02; H01L 23/48; H01L 23/16; H01L 29/44
[52] U.S. Cl. ................... 257/528; 257/686; 257/691; 257/724; 257/737; 257/738
[58] Field of Search ............... 257/686, 691, 724, 737, 257/738, 528

[56] References Cited

U.S. PATENT DOCUMENTS

| 3,748,548 | 7/1973 | Haisty et al. | 317/235 |
| 4,649,417 | 3/1987 | Burgess et al. | 357/80 |
| 4,949,163 | 8/1990 | Sudo et al. | 357/80 |
| 4,991,000 | 2/1991 | Bone et al. | 357/75 |
| 5,032,896 | 7/1991 | Little et al. | 357/75 |

FOREIGN PATENT DOCUMENTS

| 0268111 | 5/1988 | European Pat. Off. |  |
| 0414204 | 2/1991 | European Pat. Off. |  |
| 2210858 | 8/1990 | Japan | 257/528 |

OTHER PUBLICATIONS

S. Magdo, IBM Technical Disclosure Bulletin, "Low Inductance Module", Oct. 1978, New York, vol. 21, No. 5, pp. 1895-1897.

L. S. Goldman, IBM Technical Disclosure Bulletin, "Universal Electronic Package", Nov. 1984, New York, vol. 27, No. 6, pp. 3335-3336.

Primary Examiner—Sara W. Crane
Assistant Examiner—Valencia M. Wallace
Attorney, Agent, or Firm—Christie, Parker & Hale

[57] ABSTRACT

A semiconductor chip carrier has a first substrate and at least one second substrate. The first substrate is for carrying at least one semiconductor chip of integrated circuits. The first substrate has predetermined functional elements for connection to the integrated circuits of the at least one semiconductor chip. Such a second substrate is directly coupled to the first substrate. The second substrate is capable of being independently created and has predetermined electrical functional elements for connection to the integrated circuits of the semiconductor chip. The electrical functional elements of each second substrate are of one type and are different than the electrical functional elements of the other second substrates and the first substrate.

The second substrate has a top interconnect layer, a bottom interconnect layer, and a plurality of intra-substrate connectors (or through-hole connectors), where the top interconnect layer and the bottom interconnect layer have substantially identical patterns of electrical contacts. The electrical contacts may be deformable bumps, solder bumps, elastomer bumps, or gold bumps.

The electrical functional elements are electrically passive circuits, such as capacitors, resistors, or electrical signal conductors. Such a second substrate may include power supply circuits.

9 Claims, 7 Drawing Sheets

FUNCTIONAL SUBSTRATES FOR PACKAGING SEMICONDUCTOR CHIPS

TECHNICAL FIELD

The present invention relates generally to packaging of semiconductor devices and specifically to a design of chip carriers that facilitates the manufacture of semiconductor devices.

BACKGROUND OF THE INVENTION

Traditional techniques of manufacturing semiconductor devices and packages, wherein layers are built sequentially one on top of another, suffer several drawbacks. For example, layers requiring higher annealing temperature would have to be manufactured before those requiring lower annealing temperature, thereby imposing several limitations upon the design and packaging of devices.

Sequentially building of layers under traditional techniques also has low overall yield. For example, if yield in the manufacture of one layer is 90% and yield in the manufacture of another layer is 90%, the average overall yield would at most be 81%.

If a semiconductor device can be divided into separate layers that are capable of being manufactured and tested individually, drawbacks including those identified above are circumvented. For example, two layers requiring different annealing temperatures can be manufactured individually and then combined into a final product. Moreover, as devices are formed by combining only those layers have already been tested, overall yield will be limited only by the yield of the assembling step, and should thus even be higher than 90%.

Furthermore, as individual layers can be manufactured and tested in parallel, manufacturing time of a device is shortened.

SUMMARY OF THE INVENTION

In one aspect, the present invention relates to a chip carrier for use in packaging a semiconductor device. The carrier comprises a first substrate for carrying at least one semiconductor chip of integrated circuits and at least one independently manufactured second substrate directly coupled to the first substrate. The second substrate has predetermined electrical functional elements for connection to the integrated circuits of the semiconductor chip.

Advantageously, each second substrate has a top and a bottom interconnect layer with substantially identical patterns of electrical contacts so that addition and removal of a second substrate, as well as arrangement of the second substrate(s) in forming a device can be achieved conveniently.

In another aspect, the present invention relates to a process for manufacturing a semiconductor device having at least one semiconductor chip of integrated circuits. The process comprises the steps of forming a first substrate that carries the at least one semiconductor chip, forming at least one individual second substrate having a plurality of electrical functional elements, and coupling the first substrate directly to the second substrate to form a carrier for carrying the chip.

DESCRIPTION OF THE SPECIFIC EMBODIMENT

Figure 1:
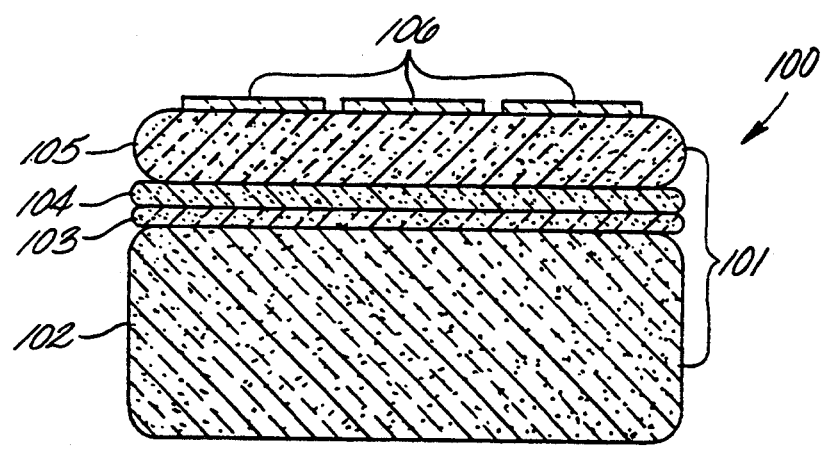
FIG. 1 shows schematically a cross-sectional illustration of a semiconductor device in which the present invention is embodied.

FIG. 1 shows schematically a cross-sectional view of a semiconductor device 100 in which the present invention is embodied. The semiconductor device 100 has a chip carrier 101 for carrying one or more semiconductor chip 106. The chip carrier 101 has a plurality of functional substrates, such as a power supply substrate 102, a thin film resistor substrate 103, a thin film capacitor substrate 104 and a signal connection substrate 105.

The functional substrates 102, 103, 104, 105 need not be arranged as shown in FIG. 1, but can in general be arranged in other configurations, depending upon the requirement of a particular device.

Figure 2:
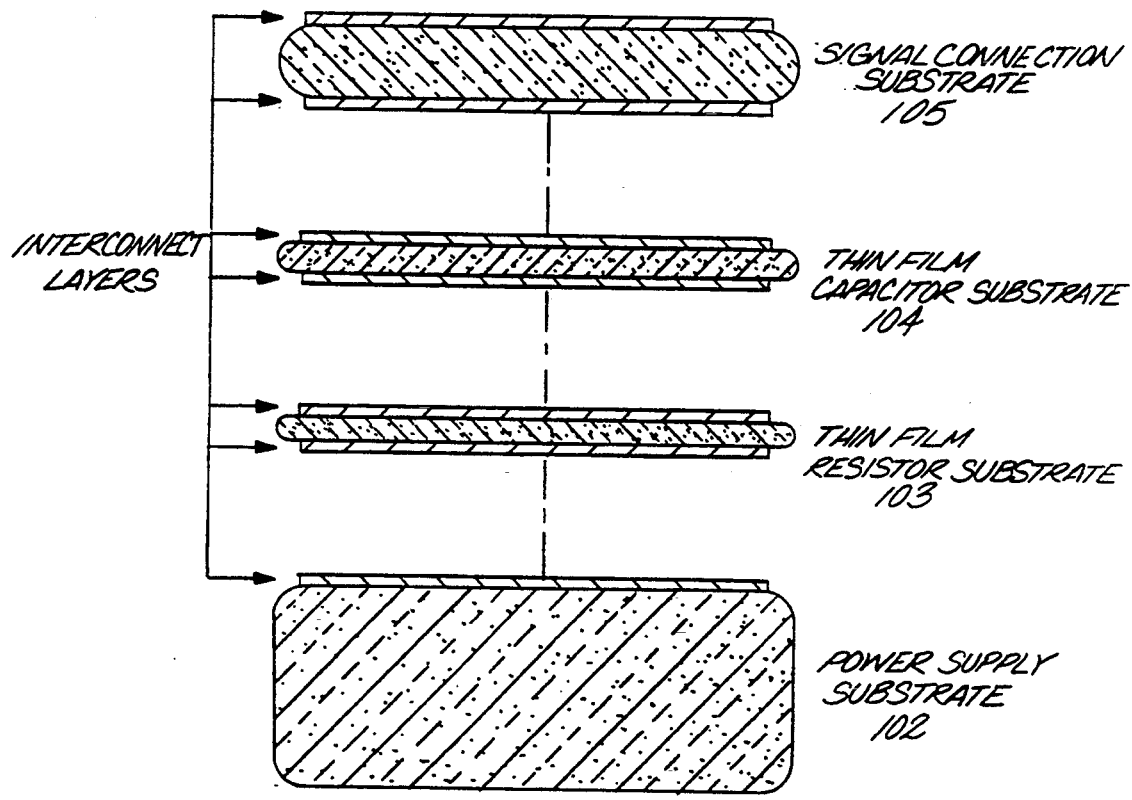
FIG. 2 shows schematically a cross-sectional illustration of the semiconductor device of FIG. 1 with the substrates separated.

FIG. 2 is a cross-sectional view of the semiconductor device 100 with the substrates 102, 103, 104, 105 separated. As shown, each of these substrates, with the exception of the power supply substrate 102, has a top interconnect layer and a bottom interconnect layer.

The power supply substrate 102 is shown to have only a top interconnect layer. This is because power supply circuits are typically placed at the bottom of a semiconductor device to facilitate heat dissipation. If needed, the power supply substrate 102 can also have both a top and a bottom interconnect layer similar to the resistor or the capacitor substrate.

Figure 3:
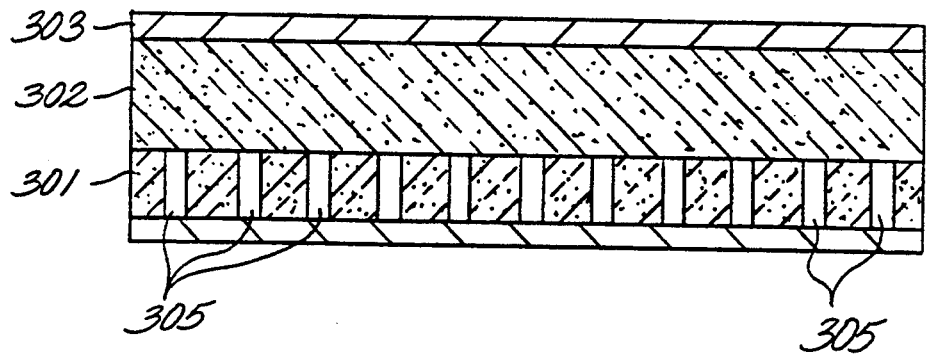
FIG. 3 shows schematically a cross-sectional illustration of the general structure of a substrate shown in FIG. 1.

The general structure of each of the substrates 102, 103, 104 and 105 is shown in more details in the cross-sectional view of FIG. 3. Each of these substrates has a plurality of predetermined functional elements formed in one or more thin film layer 302 on top of a wafer 301. The thickness of the thin film layer 302 is emphasized to facilitate illustration thereof.

For a capacitor substrate 104, a plurality of capacitors would be formed within the thin film layers 302. An exemplary structure of a thin film capacitor can be found on pages 19-3 and 19-28 of "Hand Book of Thin Film Technology", by Leon I. Maissel and Reinhard Glang; McGraw-Hill Publishing Company; 1983 Reissue. The capacitors can be used, for example, as bypass capacitors by circuits within the semiconductor chip(s) to be coupled to the chip carrier 101.

For a resistor substrate 103, a plurality of resistors would be formed in the thin film layer 302. An exemplary structure of a thin film resistor can be found on pages 18–35 of Maissel, et al. The resistors can be used, for example, as terminating resistors or pull-up resistors by circuits within the semiconductor chip(s) to be coupled to the chip carrier 101.

Referring again to FIG. 3, a top interconnect layer 303 is formed on top of each of the substrates, 102, 103, 104, 105. A bottom interconnect layer 304, is formed on the bottom of each of the substrates, 102, 103, 104. One such interconnection is found in Rao R. Tummala and Eugene J. Rymaszewski, "Microelectronics Packaging Handbook", chapter 6, p. 366, Van Norstrand Reinhold, New York, 1989. These interconnect layers are formed with the same metallurgy and design rules and have substantially identical patterns of electrical contacts so that the top interconnect layer of one substrate can be coupled to the bottom layer of another substrate. The electrical contacts can be deformable bumps, or other electrical connectors made of such material as solder, elastomer or gold.

To connect the functional elements within a substrate to its bottom interconnect layer 304 or to connect the top interconnect layer 303 to the bottom interconnect layer 304, intra-substrate connections such as through-hole connectors 305 are formed in the wafer of each substrate. The through-hole connections can be formed using known techniques such as drilling, reactive ion etching or plasma etching (see page 4, line 29 of the article by Tummala, et al).

The power supply substrate 102 has power supply circuits formed on a wafer. The power supply substrate has a top interconnect layer, but no bottom interconnect layer since the power supply substrate 102 is typically placed at the bottom of a semiconductor device package. In general, however, a bottom interconnect layer can be provided as in the other functional substrates if required by a particular design.

The above described substrates can be manufactured and tested individually and separately. After they have been tested, two or more substrates can then be bonded together (e.g. by solder) to form a semiconductor device.

Figure 4A:
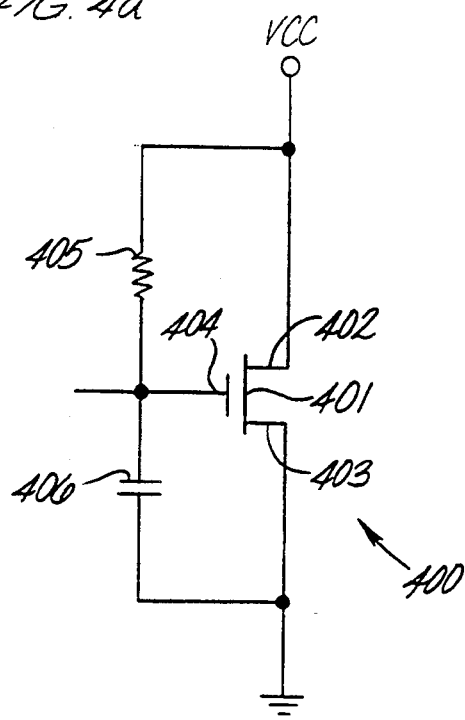
FIGS. 4a and 4b show schematically an exemplary implementation of the present invention.
Figure 4B:
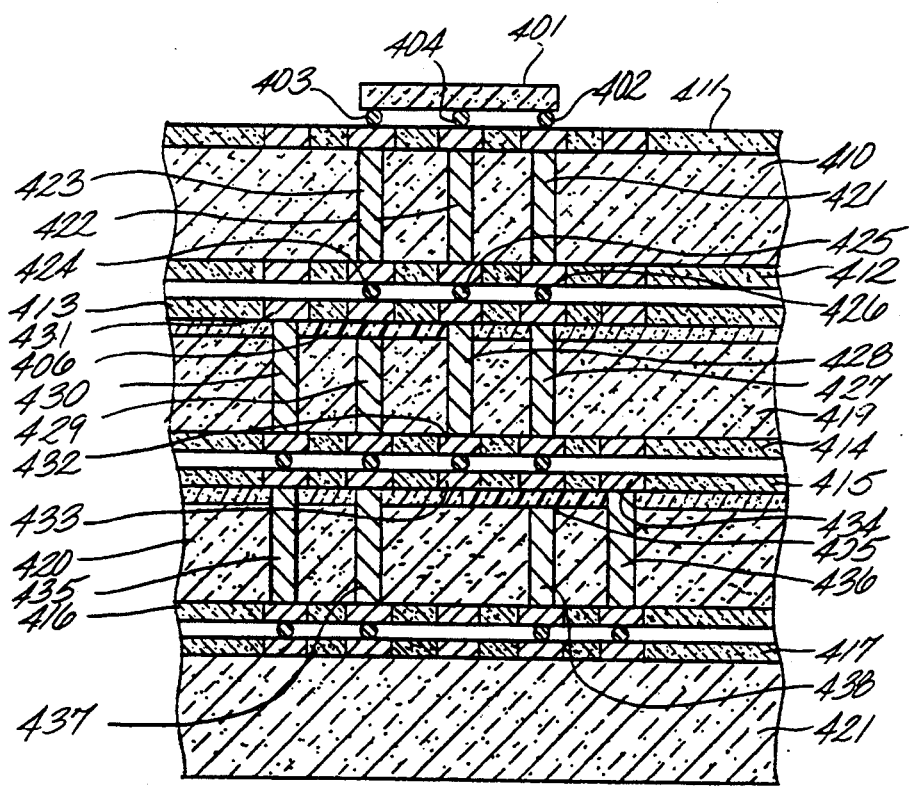

An exemplary implementation of the present invention is illustrated in FIGS. 4a and 4b.

FIG. 4a is a schematic circuit diagram of a device 400 which comprises a field effect transistor 401 having a drain terminal 402, a source terminal 403 and a gate terminal 404. The gate terminal 404 is connected through a resistor 405 to the power supply VCC to which the source terminal 402 is also connected. The gate terminal 404 is also connected through a capacitor 406 to the ground to which the drain terminal 403 is also connected.

FIG. 4b illustrates how device 400 can be implemented according to the present invention.

Referring to FIG. 4, the field effect transistor is fabricated on a semiconductor chip 401. The drain, source and gate of the transistor are bonded to the top interconnect layer 411 of the signal connection substrate 410 by connectors 402, 403, 404, respectively. In this specific implementation, no interconnection is made within the signal connection substrate 410 and the three terminals 402, 403 and 404 of the field effect transistor pass from the top interconnect layer 411 of the signal connection substrate 410, by way of three separate through-hole connections 421, 422 and 423 through the wafer, to the bottom interconnect layer 412.

From the bottom interconnect layer 412, the three terminals from the field effect transistor 401 are respectively bonded to the top interconnect layer 413 of a thin film capacitor substrate 419 by solder joints 426, 425 and 424, respectively.

Within the thin film capacitor substrate 419, a plurality of capacitors 406 are formed in a thin film layer, although only one of these capacitors is shown for reason of clarity. The gate, which is connected to point 425, is connected to one point of a capacitor 406. The other point of the capacitor 406 is connected to a point 431. Thus a signal path is formed from the gate 404 to point 425 and running through the capacitor 406 to point 431.

From point 431, the signal path of the gate passes through the capacitor substrate 419 and the resistor substrate 420 by way of through-hole connections 430, 435 until it reaches the power supply substrate 421, where it is connected to ground. Connection to ground may be accomplished through a top interconnect layer having signal lines that connect to an external ground, or as in more complicated circuits, to a circuit fabricated within the power supply substrate 421.

The gate is also connected by way of a through-hole connection 428 to a point 432 on the bottom interconnect layer 414 where it is bonded to a point 433 of the resistor substrate 420.

Within the thin film resistor substrate 420, a plurality of resistors 405 are formed in a thin film layer, although only one of these resistors is shown for reason of clarity. At point 433, the gate is connected to one point of a resistor 405 fabricated within the thin film layer. The other point of the resistor 405 is connected to point 434. Thus a signal path is formed from the gate 404 to points 425 and 433 successively, running through the resistor 405 to point 434.

From point 434, this signal gate from the gate is connected, by way of through-hole connection 456 to the power supply substrate 421 where it is connected to VCC. Connection to VCC may also be accomplished through a top interconnect layer having signal lines that connect to an external VCC.

The source terminal from the chip 401 is bonded by a connector 402 to the top interconnect layer 417 of the signal connection substrate 410. From point 402, the signal path of the source passes through the signal connection substrate 410, the capacitor substrate 419, the resistor substrate 420 by way of through-hole connections 421, 427, 438 until it reaches the power supply substrate 421, where it is connected to VCC.

The drain terminal from the chip 401 is bonded by a connector 403 to the top interconnect layer 417 of the signal connection substrate 410. From point 403, the signal path passes through the signal connection substrate 410, the capacitor substrate 419 and the resistor substrate 420 by way of through-hole connections 423, 429, 437 until it reaches the power supply substrate 421 where it is connected to ground.

Figure 4C:
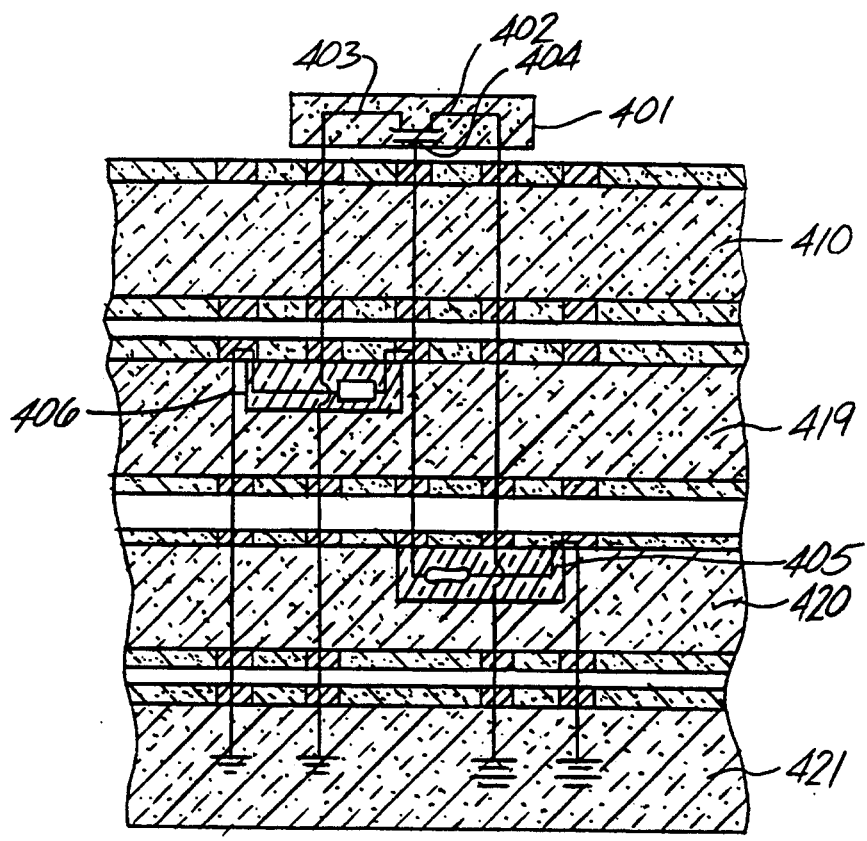
FIG. 4c is an alternate schematic illustration of how the circuit of FIG. 4a is formed in the structure of FIG. 4b.

FIG. 4c is an alternate schematic illustration of the structure of FIG. 4b to more clearly show how the circuit 400 of FIG. 4a is formed by the structure of FIG. 4b. FIG. 4c shows how the gate signal travels via the signal connection substrate 105 to the capacitor substrate 104, where it is connected to one end of a capacitor, and how the other end of the capacitor is connected to the ground. FIG. 4c also shows how the gate signal travels to the resistor substrate 103, where it is connected to one end of a resistor, and how the other end of the resistor is connected to VCC. FIG. 4c also shows how the source from the transistor travels through the signal connection substrate 105, the capacitor substrate 104 and the resistor substrate 103, bypassing the resistor, until it is connected to VCC. FIG. 4c also shows how the drain from the transistor travels through the signal connection substrate 105, the capacitor substrate 104, bypassing the capacitor, and the resistor substrate 103 until it is connected to ground.

Since the signal connection substrate 410 is not used in the above embodiment, it can actually be eliminated. However, in other implementations, the signal connection substrate 410 can be used to provide connections to other chips, or different I/O pins of the same chip.

Figure 7:
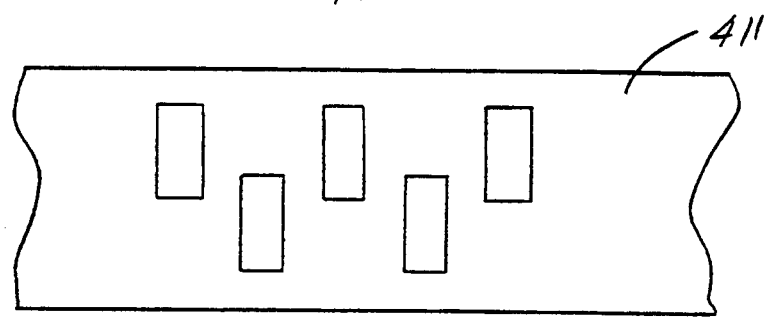
FIG. 7 illustrates schematically a top view of an exemplary pattern of contacts in each of the top and bottom interconnection layers.

The interconnect layers 411, 412, 413, 414, 415, 416 and 416 are shown in FIG. 4b to have identical pattern of electrical contacts. FIG. 7 is a top view showing an example of such pattern.

Another exemplary implementation of the present invention is now described with reference to FIGS. 6a and 6b. This exemplary implementation is provided to illustrate how a carrier without the capacitor and resistor layers is formed.

Figure 6A:
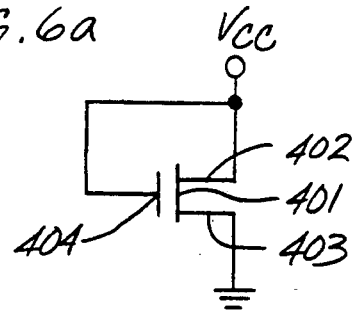
FIGS. 6a and 6b show schematically another exemplary implementation of the present invention.

FIG. 6a is a schematic circuit diagram of a device 600 which comprises a field effect transistor 401 having a drain terminal 402, a source terminal 403 and a gate terminal 404. The gate terminal 404 and the drain terminal 402 of the device 600 are connected to VCC. The source terminal 403 is connected to ground.

Figure 6B:
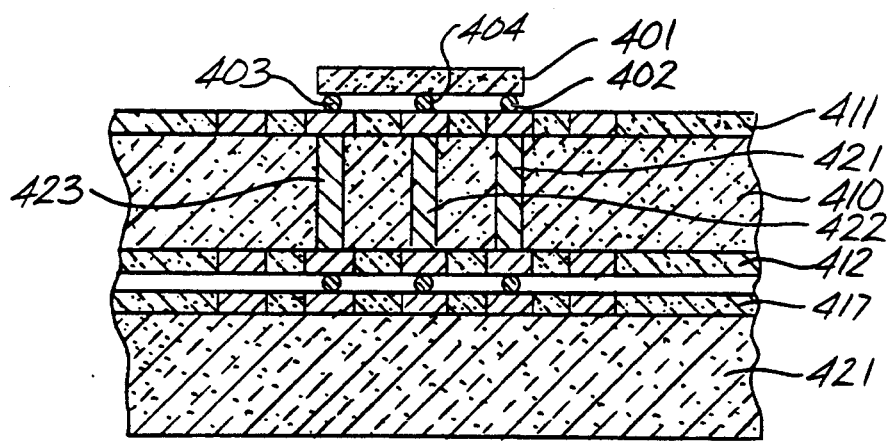

FIG. 6b illustrates how device 600 can be implemented according to the present invention. The field effect transistor is fabricated on a semiconductor chip 401 which is bonded to the top interconnect layer 411 of the signal connection substrate 410. Similar to the carrier shown in FIGS. 4a–4c, no interconnection is made within the signal connection substrate 410. The three terminals 402, 403 and 404 of the field effect transistor pass from the top interconnect layer 411 of the signal connection substrate 410, by way of three separate through-hole connections 421, 422, 423 to the bottom interconnect layer 412.

At the bottom interconnect layer 412, the gate, source and drain are connected to respective bond pads on the top interconnect layer 417 of the power supply substrate 421. Within the power supply substrate 421, the gate and the drain are connected to VCC and the source is connected to ground.

Figure 6C:
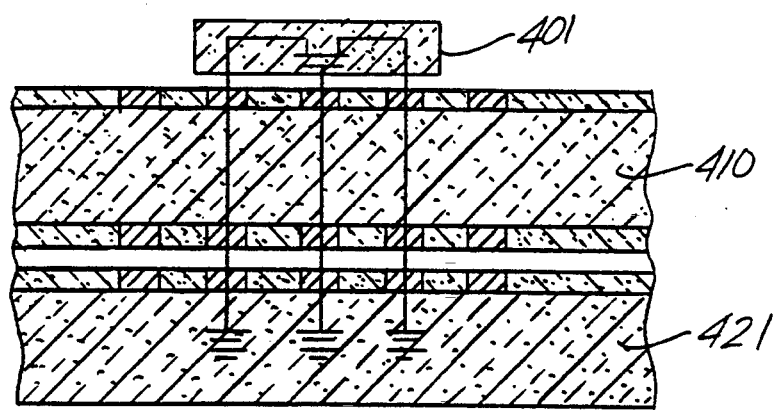
FIG. 6c is an alternate schematic illustration of how the circuit of FIG. 6a is formed in the structure of FIG. 6b.

FIG. 6c is an alternate illustration of the structure of FIG. 6b. The figure shows schematically how the circuit 600 of FIG. 6a is formed by the structure of FIG. 6b.

Figure 5:
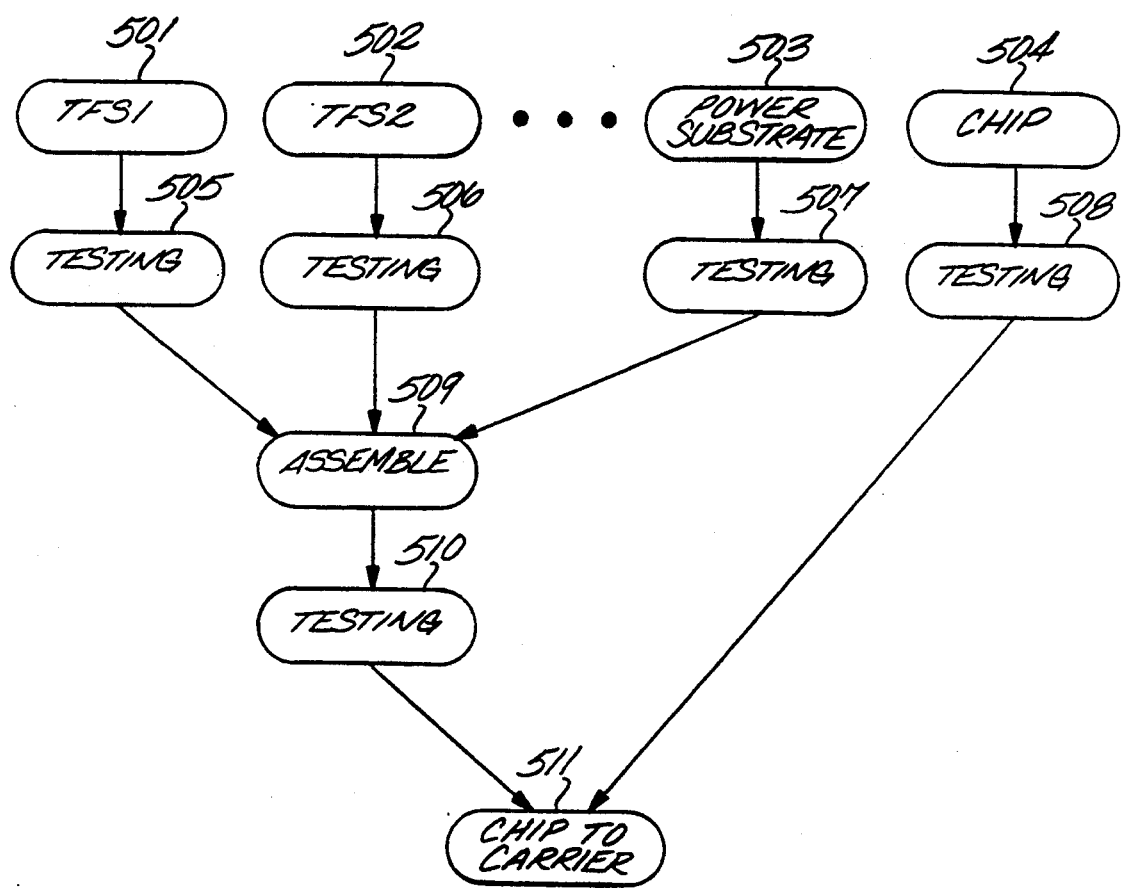
FIG. 5 is a flow chart illustrating how the present invention can accelerate manufacturing of a semiconductor device.

FIG. 5 is a flow chart illustrating how the present invention can accelerate manufacturing of a semiconductor device. Steps 501, 502, 503 and 504 depict the different functional substrates, including the power supply substrate, being manufactured in parallel with the manufacturing of semiconductor chip(s). Steps 505, 506, 507 and 508 depict the different functional substrates being tested in parallel with the testing of the power supply substrate and the semiconductor chip. In step 509, the functional substrates, including the power substrate are assembled to form a carrier. Thereafter in step 510, the assembled carrier is retested. Upon satisfactory passing of the test in step 510, the chip(s) are then placed onto the carrier to form the final device.

As the substrates and the chips are manufactured and tested in parallel, manufacturing time of a device is reduced. Moreover, by testing the chip(s) and substrates individually before final assembly thereof into a device, overall yield of the manufacturing is increased.

The description of the particular embodiments is given above for the understanding of the present invention. It will be understood that various modifications and additions can be made without substantially departing from the scope of the present invention For example, the above specific embodiments are illustrated with the functional substrates 419, 420 having only one type of electrical elements. It will be understood that different types of elements can be formed in a functional substrate. Therefore, while the invention is illustrated with the above embodiments, the scope of the present invention is defined by the following claims.

What is claimed is:

1. A semiconductor chip carrier comprising:
    a first substrate for carrying at least one semiconductor chip of integrated circuits and having a single type of predetermined passive electrical functional elements connected to said integrated circuits of said at least one semiconductor chip, wherein the passive electrical functional elements are selected from the group consisting of electrical signal conductors, capacitors, and resistors; and
    at least one second substrate directly coupled to said first substrate, said second substrate capable of being independently created and having a single type of predetermined passive electrical functional elements connected to said integrated circuits of said at least one semiconductor chip, the electrical functional elements of such a second substrate being selected from the group consisting of electrical signal conductors, capacitors, and resistors and being of a type different than the electrical functional elements of the first substrate; and wherein
    said second substrate comprises a top interconnect layer, a bottom interconnect layer and a plurality of intra-substrate connectors, said top interconnect layer and said bottom interconnect layer have substantially identical patterns of electrical contacts.

2. The semiconductor chip carrier of claim 1, wherein said intra-substrate connectors are through-hole connectors.

3. The semiconductor chip carrier of claim 1, wherein said passive elements on one substrate are a plurality of capacitors and the passive elements on the other substrate are resistors.

4. The semiconductor chip carrier of claim 1, wherein said passive elements on one substrate are a plurality of resistors and the passive elements on the other substrate are a plurality of electrical signal conductors.

5. The semiconductor chip carrier of claim 1, wherein said passive elements on one substrate are a plurality of capacitors and the passive elements on the other substrate are a plurality of electrical signal conductors.

6. The semiconductor chip carrier of claim 1, further comprising at least one substrate comprising a substrate of power supply circuits.

7. The semiconductor chip carrier of claim 1 wherein at least one of the second substrates has functional elements consisting essentially of conductors.

8. An inventory for assembling integrated circuit devices comprising a plurality of each of the following:
    (a) a resistor substrate incorporating a plurality of thin film resistors formed on the substrate and a plurality of bonding pads on each face of the resistor substrate, the resistors being connected to at least a portion of the bonding pads;

(b) a capacitor substrate incorporating a plurality of thin film capacitors formed on the substrate and a plurality of bonding pads on each face of the capacitor substrate, the capacitors being connected to at least a portion of the bonding pads;

(c) an interconnection substrate comprising a plurality of bonding pads on each face of the interconnection substrate and interconnections on the substrate making electrical connections between at least a portion of the bonding pads; and (d) integrated circuit chips electrically connected to bonding pads associated with the integrated circuit chips; and wherein the bonding pads on each face of each substrate and bonding pads on each integrated circuit chip are in an identical pattern for face-to-face interconnection.

9. A semiconductor chip carrier comprising a stack of separately manufactured substrates comprising:

(a) a resistor substrate consisting essentially of a plurality of thin film resistors formed on the substrate and a plurality of bonding pads on each face of the resistor substrate, the resistors being connected to at least a portion of the bonding pads;

(b) a capacitor substrate consisting essentially of a plurality of thin film capacitors formed on the substrate and a plurality of bonding pads on each face of the capacitor substrate, the capacitors being connected to at least a portion of the bonding pads;

(c) an interconnection substrate consisting essentially of a plurality of bonding pads on each face of the interconnection substrate and conductive interconnections on the substrate making electrical connections between at least a portion of the bonding pads; and (d) integrated circuit chips electrically connected to bonding pads associated with the integrated circuit chips; and wherein the bonding pads on each face of each substrate and bonding pads on each integrated circuit chip are in an identical pattern for face-to-face interconnection between said substrates.

* * * * *